US011230864B2

(12) United States Patent
Fontanet et al.

(10) Patent No.: US 11,230,864 B2
(45) Date of Patent: Jan. 25, 2022

(54) DEVICE FOR DETECTING, BY INDUCTION, INTENTION OF LOCKING OR UNLOCKING AN OPENING ELEMENT OF A MOTOR VEHICLE WITH PRIMARY AND SECONDARY COILS

(71) Applicants: Continental Automotive France, Toulouse (FR); Continental Automotive GmbH, Hannover (DE)

(72) Inventors: Alain Fontanet, Toulouse (FR); Armand Castandet, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 17/041,581

(22) PCT Filed: Feb. 25, 2019

(86) PCT No.: PCT/FR2019/050426
§ 371 (c)(1),
(2) Date: Sep. 25, 2020

(87) PCT Pub. No.: WO2019/186002
PCT Pub. Date: Oct. 3, 2019

(65) Prior Publication Data
US 2021/0040782 A1 Feb. 11, 2021

(30) Foreign Application Priority Data
Mar. 27, 2018 (FR) ....................... 1852636

(51) Int. Cl.
*E05B 81/76* (2014.01)
*G01L 1/12* (2006.01)
(Continued)

(52) U.S. Cl.
CPC .............. *E05B 81/77* (2013.01); *G01L 1/127* (2013.01); *G01V 3/104* (2013.01); *H03K 17/96* (2013.01);
(Continued)

(58) Field of Classification Search
CPC ....................................... E05B 81/77
See application file for complete search history.

(56) References Cited

U.S. PATENT DOCUMENTS 5,973,650 A * 10/1999 Nakanishi ................ H01Q 7/00
343/742
6,583,764 B2 * 6/2003 Ieda ..................... H01Q 1/3283
343/742
(Continued)

FOREIGN PATENT DOCUMENTS

| CN | 106338772 A | 1/2017 |
|----|-------------|--------|
| DE | 102015119096 A1 | 5/2017 |

(Continued)

OTHER PUBLICATIONS

English Translation of Written Opinion for International Application No. PCT/FR2019/050426, dated May 31, 2019, 6 pages.
(Continued)

*Primary Examiner* — K. Wong
(74) *Attorney, Agent, or Firm* — RatnerPrestia

(57) ABSTRACT

A device for detecting the intention to lock or unlock a vehicle opening element integrated into a handle and including a housing, a variation in the position of a target occurring under pressure from a user on the handle. A primary coil has turns wound in a plane parallel to the plane of the surface of the target. A receiver secondary coil that receives a magnetic field induced by the primary coil and has its turns wound in a plane parallel to the plane of the turns of the primary coil and with the target at least partially intercalated between the
(Continued)

primary and secondary coils when pressure is applied to the handle. A variation in the magnetic field received by the secondary coil is detected by a measurement device for measuring a parameter resulting from the voltage induced in the secondary coil.

13 Claims, 2 Drawing Sheets

(51) Int. Cl.
  *G01V 3/10* (2006.01)
  *H03K 17/96* (2006.01)
(52) U.S. Cl.
  CPC ..... *E05Y 2400/86* (2013.01); *E05Y 2900/531* (2013.01); *H03K 2217/96038* (2013.01)

(56) References Cited

U.S. PATENT DOCUMENTS

| | | | | |
|---|---|---|---|---|
| 6,812,823 | B2 * | 11/2004 | Inaba | B60R 25/00 340/5.6 |
| 7,180,281 | B2 * | 2/2007 | Inuzuka | E05B 81/76 324/690 |
| 10,147,252 | B2 * | 12/2018 | Schindler | H04L 12/40 |
| 10,428,562 | B2 | 10/2019 | Guibbert et al. | |
| 2017/0016255 | A1 | 1/2017 | Guibbert et al. | |
| 2019/0368238 | A1 * | 12/2019 | Spick | H03K 17/955 |

FOREIGN PATENT DOCUMENTS

| | | |
|---|---|---|
| FR | 3038642 A1 | 1/2017 |
| FR | 3044148 A1 | 5/2017 |
| FR | 3043197 A1 | 6/2017 |

OTHER PUBLICATIONS

International Search Report and Written Opinion for international Application No. PCT/FR2019/050426, dated May 31, 2019, 8 pages.

International Search Report and Written Opinion for International Application No. PCT/FR2019/050426, dated May 31, 2019, 14 pages (French).

Chinese Office Action for Chinese Application No. 201980035701.X, dated Apr. 14, 2021, with translation, 7 pages.

* cited by examiner

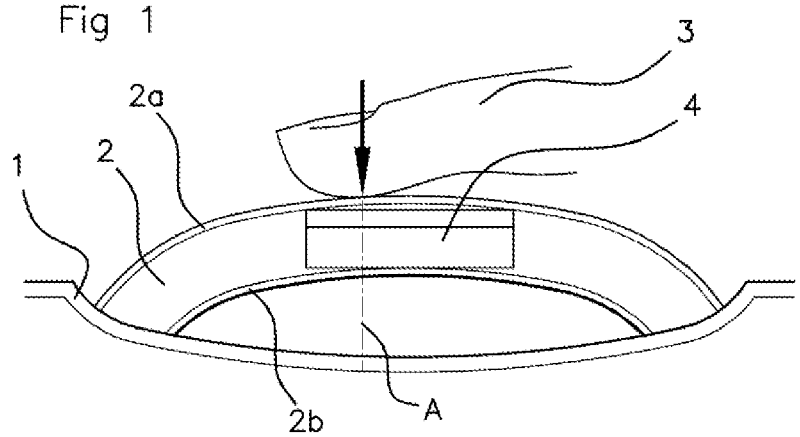
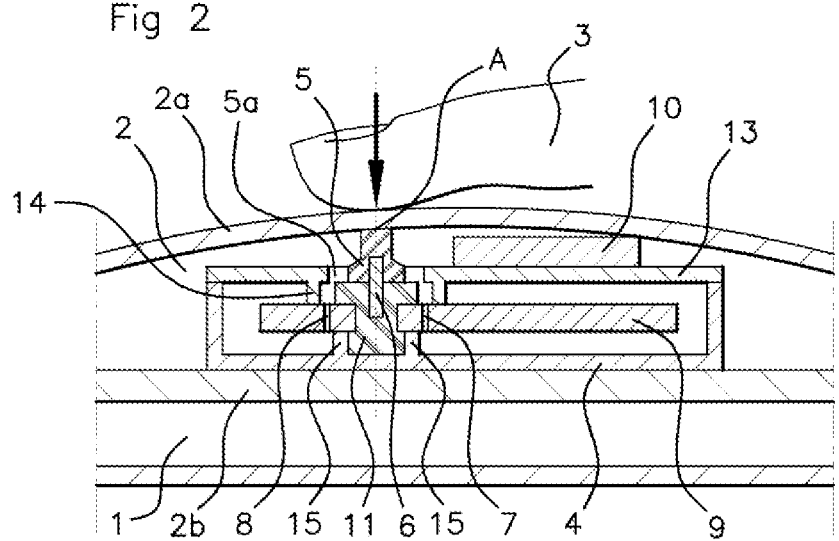
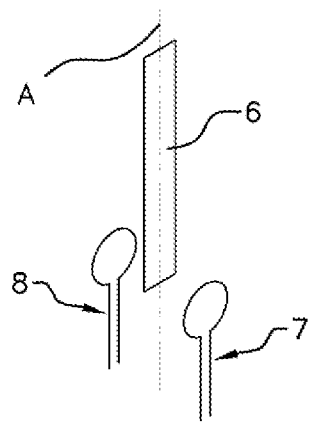

DEVICE FOR DETECTING, BY INDUCTION, INTENTION OF LOCKING OR UNLOCKING AN OPENING ELEMENT OF A MOTOR VEHICLE WITH PRIMARY AND SECONDARY COILS

CROSS REFERENCE TO RELATED APPLICATIONS

This application is the U.S. National Phase Application of PCT International Application No. PCT/FR2019/050426, filed Feb. 25, 2019, which claims priority to French Patent Application No. 1852636, filed Mar. 27, 2018, the contents of such applications being incorporated by reference herein.

FIELD OF THE INVENTION

The present invention relates to a device for detecting the intention of a user to lock or unlock an opening element of a motor vehicle, this device operating by induction between at least one emitter primary coil and at least one receiver secondary coil.

The detection device is intended to be integrated into an opening element handle or frame and consists of a housing containing an element that is elastically deformable along a predetermined axis comprising a contact region internal to the handle facing a contact region for contact with a hand of the user on an external contour of the handle.

The device comprises a printed circuit board, a voltage source and at least one emitter primary coil, the deformable element being associated with an amagnetic metal target having a planar surface, a variation in the position of the target moving along the predetermined axis occurring under pressure from a hand of the user on the handle.

BACKGROUND OF THE INVENTION

Nowadays, vehicle door handles are fitted with devices for detecting the presence of a user. The detection of the presence of a user, coupled with the recognition of a "hands-free" electronic fob for remote access control carried by this user, allows the remote locking and unlocking of the opening elements of the vehicle. Thus, when the user, carrying the corresponding electronic fob identified by the vehicle, wishes to unlock the vehicle, they approach the handle or touch the door handle of the vehicle, and the opening elements of the vehicle are then automatically unlocked.

By approaching or by pressing on a precise location of the handle of an opening element of the vehicle, called "unlocking region", the opening element or all of the opening elements of the vehicle is/are unlocked without any other action from the user. Conversely, when the user, still carrying the necessary fob identified by the vehicle, wishes to lock their vehicle, they close the door of their vehicle and approach or momentarily press on another precise location of the handle, called "locking region". This movement makes it possible to lock the opening elements of the vehicle automatically.

These presence detection devices generally comprise two capacitive sensors, in the form of two electrodes connected electrically to a printed circuit board and integrated into the door handle, each in a precise locking or unlocking region. Generally, one electrode is dedicated to each region, that is to say one electrode is dedicated to detecting the approach and/or the contact of the hand of the user in the locking region and one electrode is dedicated to detecting the approach and/or the contact of the hand of the user in the unlocking region.

The presence detection device further comprises a generally low-frequency radiofrequency antenna. The detection device is connected to the electronic computer of the vehicle in an electronic control unit and sends it a presence detection signal. The electronic computer of the vehicle has, beforehand, identified the user as being authorized to access this vehicle, or alternatively, following the reception of this presence detection signal, it performs this identification. To this end, it sends an identification request to the fob carried by the user by way of the radiofrequency antenna.

The fob in response sends its identification code to the electronic computer of the vehicle through radiofrequency waves. If the electronic computer recognizes the identification code as the one authorizing access to the vehicle, it triggers the locking/unlocking of one or of all of the opening elements. If, however, the electronic computer has not received any identification code or if the received identification code is erroneous, locking or unlocking is not performed.

Such vehicles are therefore equipped with opening element handles comprising a detection device, itself comprising a generally low-frequency radiofrequency antenna, and two electrodes connected to a microcontroller, integrated into a printed circuit board and supplied with a voltage.

However, this detection device of the prior art has major drawbacks. Specifically, the detection of the approach of a user by capacitive sensors is not robust and generates false detections.

In particular, in some environmental conditions, when the ambient air is humid or when there is salt on the roads, capacitive coupling is created between the detection regions and the metal parts of the vehicle, thereby preventing any detection of the presence of a user using the capacitive sensors.

In addition, raindrops or snowflakes on the door handle increase the capacitance measured by the capacitive sensors, thus triggering false detections.

Lastly, detection by capacitive sensors is incompatible with handles coated with metallic paints or comprising chromed surfaces, the presence of metal in the handle creating a coupling with the detection regions and inhibiting the detection of the presence of a user.

To overcome these drawbacks, it has been proposed, in particular by document FR-A-3 044146, incorporated herein by reference, to use an inductive sensor in the device for detecting the intention to lock or unlock an opening element, the inductive sensor comprising inter alia an amagnetic metal target and a coil emitting a magnetic field. The amagnetic metal target is able to move along a predetermined axis substantially perpendicular to the plane of the primary coil.

The emitter coil is connected to a capacitor and forms, with the capacitor, an oscillating circuit having a specific resonant frequency with means for adjusting the frequency of the oscillating circuit to a predetermined frequency. The target is connected by means for transmitting a deformation of an element that is elastically deformable along the predetermined axis arranged in a handle of the opening element and comprising a region of contact internal to the handle with the amagnetic metal target causing its movement.

Means for measuring an inductance of the coil are provided as well as means for comparing the measured inductance with a predetermined inductance threshold value, in order to detect the intention of the user to lock or unlock the door.

The target, as an electrically conductive part, is positioned, when pressure from the hand of a user is applied to the handle of the opening element, in the vicinity of a coil supplied with a frequency that is sufficiently high, for example a few megahertz, to generate a substantial skin effect in the conductive part.

A variation in the position of the conductive part therefore causes the specific inductance of the coil to vary. The flux produced by the coil does not penetrate into the conductive part because of the skin effect.

The variation in the inductance of the coil and the variation in the specific frequency of the coil are detected in order to detect the variation in the position of the target. As this target can be placed such that it is connected to a portion of the handle via the elastically deformable contact element, when the user presses their hand against this portion of the handle, the position of the target varies. The inductance of the coil varies. Suitable electronics can therefore detect the pressure from the hand and effect a closing or opening of the opening element of the motor vehicle.

The variation in the position of the target caused by pressing the hand against the handle is very small, of the order of a few hundredths of a millimeter. The handle must be deformed in a highly specific region, but the force transmitted must be limited because it is not possible to deform the printed circuit board beneath the conductive part without risking breaking it. Reliability of detection is therefore not guaranteed. In this prior art, the movement of the target occurs perpendicular to the plane of the emitter coil, and only the small movement of the target can cause the inductance of the coil to vary.

SUMMARY OF THE INVENTION

The problem underlying an aspect of the present invention is, for a device for detecting the intention of a user to lock or unlock an opening element of a motor vehicle, this detection device operating according to the principle of an induction sensor, to increase the variation in inductance detected in the detection device when the target moves subsequent to the hand of a user being pressed against a handle of the opening element, which makes it possible to improve the reliability of pressure detection.

To this end, an aspect of the present invention relates to a device for detecting the intention of a user to lock or unlock an opening element of a motor vehicle, the device being intended to be integrated into an opening element handle or frame and consisting of a housing containing an element that is elastically deformable along a predetermined axis comprising a region of contact with the opening element handle or frame, the device comprising a printed circuit board, a voltage source and at least one emitter primary coil, the deformable element being associated with an a magnetic metal target having a planar surface, a variation in the position of the target moving along the predetermined axis occurring under pressure from a hand of the user on the opening element handle or frame, noteworthy in that the primary coil has turns wound in a plane parallel to the plane of the surface of the target, at least one receiver secondary coil that receives a magnetic field and a voltage induced by said at least one primary coil and is located facing said at least one primary coil with its turns wound in a plane parallel to the plane of the turns of said at least one primary coil and with the target at least partially intercalated between said at least one primary coil and said at least one secondary coil when pressure from the user is applied to the opening element handle or the frame, a variation in the induced magnetic field received by said at least one secondary coil being detected by measurement means for measuring a parameter resulting from the voltage induced in the secondary coil when pressure from a hand of the user is applied to the opening element handle or frame.

An aspect of the present invention envisages arranging the target in a plane parallel to the planes of the primary and secondary coils and perpendicular to the printed circuit board bearing the primary and secondary coils, that is to say parallel to the turns of the coil.

The movement has a guillotine effect. It is an area of the target which is interposed between the primary and secondary coils instead of the target being brought closer to the coils.

A greater variation in flux is thus obtained, the area of the target influencing this variation whereas previously, according to the closest prior art, only the distance between target and coils was taken into consideration. In a movement of the target, there is a variation in the area facing the coil and no longer just in the distance between the target and the coil.

According to prior art with a single emitter coil, a variation in induced current is measured, while, according to the present invention, with a primary coil and a secondary coil, a variation in flux is measured.

Advantageously, said at least one primary coil and secondary coil have their turns wound and centered around a width of the printed circuit board which is planar and perpendicular to the planes of said at least one primary coil and secondary coil, a normal to the plane of the turns of said at least one primary coil and secondary coil extending in the plane of the printed circuit board. The primary and secondary coils are then partially integrated into the printed circuit board, which saves space.

Advantageously, the turns of said at least one primary coil and secondary coil are wound while passing through a thickness of the printed circuit board. This contributes to even greater integration of the primary and secondary coils. In addition to saving space, better retention of the primary and secondary coils by the printed circuit board is obtained, the portions of the printed circuit board surrounding the turns performing this retention.

Advantageously, the printed circuit board has a groove running widthwise in the printed circuit board, an end portion of the target being inserted into the printed circuit board when pressure from a hand of the user is applied to the handle, an internal contour of the groove corresponding to an external contour of the target, dimensions of the internal contour of the groove being at least slightly larger than the dimensions of the external contour of the end portion of the target in order to allow insertion of the end portion of the target with clearance.

Space is again saved. Since the primary and secondary coils are integrated at least partially into the printed circuit board, so that the target is facing these coils, the target should also be able to penetrate into the printed circuit board. The edges of the groove may also serve to guide the target and means for elastically returning the target to its starting position may also be housed at least partially in the printed circuit board.

Advantageously, the groove passes through an entire thickness of the printed circuit board, one face of the printed circuit board opposite the face via which the target is inserted bearing a resilient deformable part having a flange that bears against the opposite face of the printed circuit board and an end piece that penetrates into the groove with a depth allowing it to make contact and to be deformed by contact with the end portion of the target inserted into the groove in the maximum insertion position, the end piece returning to an undeformed position while pushing the end portion of the target out of the groove when no pressure from the hand of the user is exerted on the deformable contact element.

The end piece serves as a means for returning the target to its starting position, that is to say the position corresponding to no pressure from the hand of a user on the handle. Without this position return, the target would remain in the position assumed under the pressure from the hand of a user on the handle and no detection of intention would then be possible because no variation in the magnetic coupling would occur between primary and secondary coils.

Advantageously, the detection device comprises two emitter primary coils that are coupled on each side of the target or on the same side of the target.

Advantageously, the detection device comprises two receiver secondary coils that are arranged on the same side of the target while being electrically independent.

Advantageously, the two secondary coils are concentric, with a first secondary coil comprising two loops in opposite directions and of equal area generating a sine signal of said at least one parameter resulting from the voltage induced in the first secondary coil and a second secondary coil comprising three loops including one large loop and two small loops, the two small loops being in the same direction and in the opposite direction to the large loop, the second secondary coil generating a cosine signal of said at least one parameter resulting from the voltage induced in the second secondary coil, the sine or cosine signals of the first and second secondary coils, respectively, being temporally correlated by calculation means in order to precisely determine the position of the target in the detection device.

Such an arrangement serves to precisely track the travel of a target, which is not necessarily the aim of the present invention. However, this makes it possible to control the detection of a variation in the position of the target, which increases the reliability of the detection.

Advantageously, the target is made of conductive material of low resistivity.

Advantageously, the element that is elastically deformable along a predetermined axis comprising a region of contact with the handle comprises a central body bearing the contact region and a longitudinal end of the target in opposition, the central body being borne by at least one member that is deformable along the predetermined axis, one end of which is connected to the central body and another, opposite end bears against the printed circuit board, a deformation of said at least one deformable member under pressure from a hand of the user on the handle resulting in a variation in the position of the target moving along the predetermined axis.

An aspect of the invention relates to an external handle or a frame of an opening element of a motor vehicle comprising such a detection device and at least one elastically deformable external contour region that is aligned along the predetermined axis with the contact region.

An aspect of the invention also relates to a motor vehicle comprising at least one such handle on at least one opening element.

BRIEF DESCRIPTION OF THE DRAWINGS

Other features, aims and advantages of aspects of the present invention will become apparent on reading the detailed description that follows and on examining the appended drawings given by way of non-limiting examples, and in which:

FIG. 1 schematically shows a sectional view of a motor vehicle door handle with a device for detecting the intention of a user to lock or unlock a motor vehicle door, this device, whose features are not identified in FIG. 1, potentially being a device according to an aspect of the present invention, FIG. 2 schematically shows a sectional view of a motor vehicle door handle at the level of the device for detecting the intention of a user to lock or unlock a motor vehicle door according to one embodiment of the present invention, the device comprising primary and secondary coils with a target moving in a plane parallel to the plane of each primary or secondary coil, FIG. 3 schematically shows a perspective view of a target intercalated between a primary coil and a secondary coil, the target and the coils forming part of the device for detecting the intention of a user to lock or unlock a motor vehicle door according to a first embodiment of the present invention, the turns of the primary and secondary coils being in respective planes parallel to the plane of the target, FIG. 4 schematically shows a perspective view of a printed circuit board and of a target forming part of the device for detecting the intention of a user to lock or unlock a motor vehicle door according to a second embodiment of the present invention, the turns of the primary and secondary coils being wound around and inside the printed circuit board bearing a groove in its width for the passage of the target into the position in which the hand of a user is being pressed against the handle of the opening element of the motor vehicle, FIG. 5 schematically shows a longitudinal sectional view of a printed circuit board and a target forming part of the device for detecting the intention of a user to lock or unlock a motor vehicle door according to a third further embodiment of the present invention, an elastically deformable end piece being inserted into the groove of the printed circuit board so as to push the target out of the groove when no pressure from the hand of the user is exerted on the handle, and FIG. 6 schematically shows a view from above of winding portions of two secondary coils forming part of the device for detecting the intention of a user to lock or unlock a motor vehicle door according to a fourth embodiment of the present invention, the windings being shown flat in this FIG. 6, whereas the windings are circular in shape in the detection device according to an aspect of the present invention.

DETAILED DESCRIPTION OF THE PREFERRED EMBODIMENTS

Figure 4:
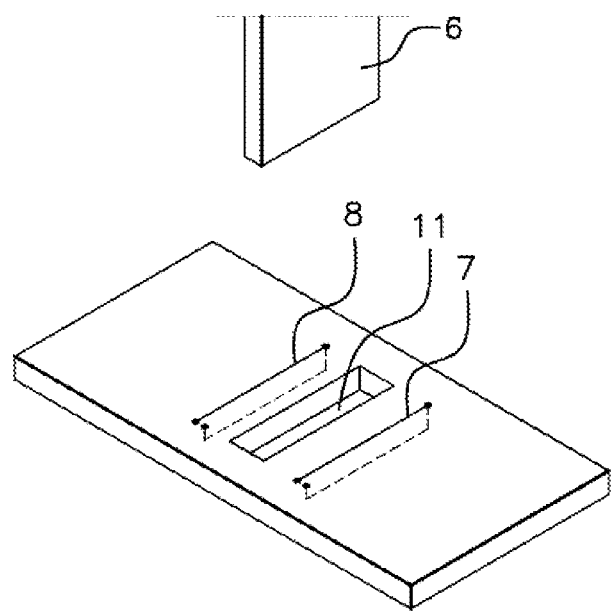

In what follows, the detection device is associated with a motor vehicle opening element handle. However, it may also be associated with an opening element frame when the frame defines an empty interior space sufficient for receiving the detection device.

With particular reference to FIGS. 1 and 2, although FIG. 1 does not show the features of the detection device, an aspect of the present invention relates to a device for detecting the intention of a user to lock or unlock an opening element 1 of a motor vehicle. The opening element 1 is advantageously a motor vehicle door but may also be the trunk of the motor vehicle or any other opening element.

The device is intended to be integrated into a handle 2 and consists of a housing 4 containing an element 5*a* that is elastically deformable along a predetermined axis A comprising a region of contact with the handle 2.

As can be seen with reference to FIG. 2, the device comprises a printed circuit board 9, a voltage source and at least one emitter primary coil 7. In FIG. 2, the primary coil 7 is recognizable by its turns, only two of which are drawn, highly schematically and spaced apart from one another, but the number of turns can of course be greater. The emitter primary coil 7 is shown to the right of a target 6 in this FIG. 2 but the primary coil 7 could just as well be located laterally to the left of the target 6.

The deformable element 5, 5a is associated with an amagnetic metal target 6 having a planar surface. A variation in the position of the target 6 moving along the predetermined axis A occurs under pressure from a hand 3 of the user on the handle 2. In FIG. 2, there is only one primary coil 7, but this is not limiting.

According to an aspect of the present invention, the primary coil 7 has turns wound in a plane parallel to the plane of the surface of the target 6. In addition, the detection device is provided with at least one receiver secondary coil 8 that receives a magnetic field induced by said at least one primary coil 7 and is located facing said at least one primary coil 7 with its turns wound in a plane parallel to the plane of the turns of said at least one primary coil 7. In FIG. 2, there is only one secondary coil 8, but this is not limiting.

The target 6 is at least partially intercalated between the one or more primary coils 7 and the one or more secondary coils 8 when pressure from the user is applied to the handle 2. A variation in the magnetic field and in an induced voltage received by the one or more secondary coils 8 is detected by measurement means for measuring a parameter resulting from the voltage induced in the secondary coil 8 when pressure from a hand 3 of the user is applied to the handle 2.

The proposed solution consists in using an element for transmitting the movement of the hand when it is pressed against the handle which is perpendicular to the surface used for the detection of the movement. A movement of this element perpendicular to the detection circuit is detected.

In this case, the plane of the surface of the target 6 is perpendicular to the plane of the surface of the handle 2 against which the hand 3 of the user is pressed.

For this detection, an emitter primary coil 7 is positioned in a plane parallel to the surface of the target 6. A receiver secondary coil 8 is also positioned, in another, parallel plane. The target 6 is made of amagnetic conductive metal. The variation in the position of the target 6 results in a variation in the coupling between the two, primary 7 and secondary 8, coils.

An aspect of the invention also relates to an external handle 2 of a motor vehicle opening element comprising such a detection device and at least one elastically deformable external contour region that is aligned along the predetermined axis A with the contact region. This can also apply to an opening element frame.

An aspect of the invention also relates to a motor vehicle comprising at least one such opening element handle 2 or frame.

The one or more primary coils 7 and the one or more secondary coils 8 may have their turns wound and centered around a width of the printed circuit board 9, the printed circuit board 9 being planar and perpendicular to the planes of the one or more primary coils 7 and of the one or more secondary coils 8.

A normal to the plane of the turns, hence the middle of a coil of the primary 7 and secondary 8 coils, may extend in the plane of the printed circuit board 9. The coils 7, 8 may therefore be centered on the printed circuit board 9, advantageously on a middle of a width of the printed circuit board 9.

As non-essential features of an aspect of the present invention, the housing 4 containing the element 5a that is elastically deformable along a predetermined axis A comprising a region of contact with the handle 2 may rest on an internal portion 2b of the handle 2 opposite an external portion 2a of the handle 2 which is facing away from the vehicle and against which the finger 3 of the user is pressed.

The internal portion 2b of the handle 2 rests against the opening element 1 of the motor vehicle or is facing the opening element 1 of the motor vehicle. It is between the internal portion 2b of the handle 2 facing the opening element 1 and the external portion 2a of the handle 2 facing away from the exterior of the vehicle that an empty space houses the detection device according to an aspect of the present invention in the housing 4.

The housing 4 may be open at its end facing the exterior of the handle 2, that is to say facing its external portion 2a, and covered with a cover 13, which however lets a central body 5 of the elastically deformable element 5a protrude from the housing.

According to one non-essential but advantageous feature of an aspect of the present invention, the element 5a that is elastically deformable along a predetermined axis A, advantageously perpendicular to the printed circuit board 9, may comprise a region of contact with the interior face of the external portion 2a of the handle 2 that is aligned with the region of contact of a finger 3 of the user against the exterior face of the external portion 2a of the handle 2.

The elastically deformable element 5a may comprise a central body 5 that bears the contact region on one face and a longitudinal end of the target 6 on an opposite face. In FIG. 2, the end of the target 6 associated with the elastic element 5a penetrates into a slot made in the central body 5 over approximately ¼ to ⅓ of the length of the target 6, but this is not limiting.

The central body 5 may be rigid and not be deformable. However, the central body 5 may be borne by at least one member 5a that is deformable along the predetermined axis A, for example one or more tabs.

Said at least one deformable member 5a may comprise one end which is connected to the central body 5 and another, opposite end which bears against the printed circuit board 9. It follows that a deformation of said at least one deformable member 5a under pressure from a hand 3 of the user on the handle 2 causes a variation in the position of the target 6 moving along the predetermined axis A through flexion of said at least one deformable member 5a.

To prevent said at least one deformable member 5a from twisting other than along the predetermined axis A, the cover 13 comprises means 14 for laterally supporting said at least one deformable member 5a that extend toward the printed circuit board 9.

In its portion that serves as its base and is supported by the internal portion 2b of the handle 2, the housing 4 may have two lugs 15 on its interior that point toward the interior of the housing 4 in order to support the printed circuit board 9.

Between a portion of the cover 13 and the internal wall of the external portion 2a of the handle 2, inside the handle 2, a layer of foam 10 may be locally inserted.

FIG. 3 shows a first embodiment with an arrangement of the emitter primary 7 and receiver secondary 8 coils in relation to the target 6. It can be seen that the respective planes of the turns of, on the one hand, the emitter primary coil 7 and, on the other hand, the receiver secondary coil 8 are parallel to the plane of the target 6, the target 6 potentially being rectangular with its length oriented along the predetermined axis A.

Referring more particularly to FIG. 4, in a second embodiment, the turns of said at least one primary coil 7 and secondary coil 8 may be wound while passing through a thickness of the printed circuit board 9. Alternatively, the turns could be wound around the printed circuit board 9 without penetrating into the printed circuit board 9, but this is not preferred.

Independently of this preceding feature or in addition to this feature as shown in FIG. 4, the printed circuit board 9 may have a groove 11 running widthwise in the printed circuit board 9. An end portion of the target 6, opposite that inserted into the central body of the elastically deformable element, may be inserted into the printed circuit board 9 when a hand 3 of the user is pressed against the handle 2.

The groove 11 may be configured to the dimensions of the target 6, an internal contour of the groove 11 corresponding to an external contour of the target 6. It is possible to choose the internal dimensions of the groove 11 to be slightly larger than the dimensions of the external contour of the target 6 just to allow insertion with limited clearance of the end portion of the target 6 in the groove 11.

Figure 5:
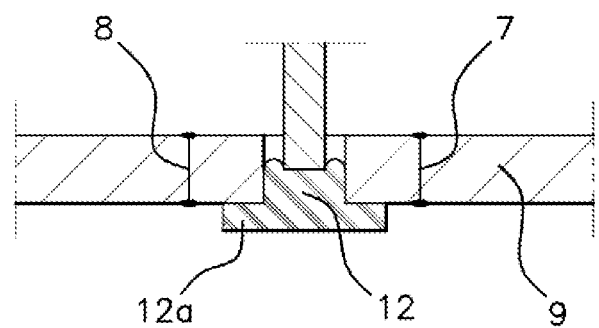

FIG. 5 shows a third, optional embodiment of the detection device according to the present invention. This embodiment also features the presence of a groove 11 passing through the thickness of the printed circuit board 9.

In this embodiment, the groove 11 may pass through an entire thickness of the printed circuit board 9. One face of the printed circuit board 9 opposite the face via which the target 6 is inserted may bear a resilient deformable part 12, 12a having a flange 12a that bears against the opposite face of the printed circuit board 9 and an end piece 12.

The end piece 12 penetrates into the groove 11 with sufficient depth to allow it to make contact and to be deformed by contact with the end portion of the target 6 inserted into the groove 11 in the maximum insertion position. Since the end piece 12 is elastically returned to its undeformed position, the end piece 12 can return to an undeformed position while pushing the end portion of the target 6 out of the groove 11 when no pressure from the hand of the user is exerted on the deformable contact element. This allows the target 6 to return automatically to its rest position without detection of intention to lock or unlock.

It is also possible to envisage an elastic return means for returning the target into position. This elastic return means may be a metal strip bearing against the face of the printed circuit board facing the target.

For a target that does not enter the printed circuit board, the return means may be an elastic rod connecting the target to a fixed support, one end of the elastic rod being connected to the target and the other end to the fixed support, the elastic rod tilting toward the printed circuit board as the target descends but returning to its original position while pushing the target back.

As shown in FIG. 5, for a target that enters the printed circuit board 9, it is possible to envisage, in the printed circuit board 9, a primary coil 7 and a secondary coil 8, the primary and secondary coils being arranged on a respective side of the groove 11 that passes through the printed circuit board 9.

Figure 6:
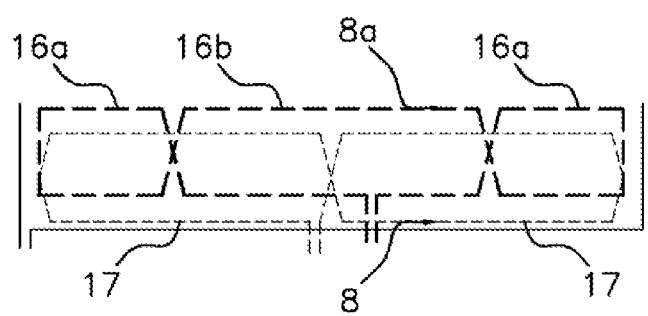

With reference to FIG. 6, the detection device may comprise two receiver secondary coils 8, 8a that are arranged on the same side of the target 6 while being electrically independent.

For simplicity, the loops of the secondary coils 8, 8a are shown flat in this FIG. 6 although this is not the case in reality.

In this optional embodiment, the two secondary coils 8, 8a may be concentric. A first secondary coil 8 may comprise two loops 17 in opposite directions and of equal area generating a sine signal of said at least one parameter resulting from the voltage induced in the first secondary coil 8.

A second secondary coil 8a may include three loops 16a, 16b, 16a including one large loop 16b and two small loops 16a, the two small loops 16a being in the same direction and in the opposite direction to the large loop 16b. The second secondary coil 8a may generate a cosine signal of said at least one parameter resulting from the voltage induced in the second secondary coil 8a.

The sine or cosine signals of the first and second secondary coils 8, 8a, respectively, may be temporally correlated by calculation means in order to precisely determine the position of the target 6 in the detection device.

The emitter primary coil, denoted by 7 in the preceding figures, allows a magnetic field to be generated as current flows through the turns of the primary coil. The magnetic field thus created is perceived by the two receiver secondary coils 8, 8a and induces a voltage in the secondary coils 8, 8a.

When a target 6 made of a conductive material, in order to allow eddy currents to flow, moves relative to the coils 8, 8a and the target is opposite the primary winding and secondary windings 8, 8a, the target 6 modifies the magnetic coupling between the primary coil and the two secondary coils 8, 8a. By measuring the voltages across the terminals of the secondary coils 8, 8a, it is possible to deduce the precise position of the target 6 in the detection device.

Specifically, with the target 6 present between the primary and secondary coils 8, 8a, each secondary coil 8, 8a receives a lower amount of magnetic field flux than if the target were absent. If, for example, for the first secondary coil 8 with two loops of opposite orientations 17, the target 6 moves past one and then the other of these loops, the first secondary coil 8 receives, with respect to a zero average value, a relative increase and then a relative decrease in the amount of magnetic field flux through it.

With reference to all of the figures, many other embodiments, even ones not shown in the figures, may be implemented. The optional embodiments mentioned are not limiting.

For example, the detection device may comprise two emitter primary coils 7 coupled on each side of the target 6 or on the same side of the target 6. Regarding the target 6, the target 6 may be made of conductive material of low resistivity.

The invention claimed is:

1. A device for detecting an intention of a user to lock or unlock an opening element of a motor vehicle, the device being intended to be integrated into an opening element handle or frame and consisting of a housing containing an element that is elastically deformable along a predetermined axis comprising a region of contact with the handle, the device comprising:
   a printed circuit board,
   a voltage source and
   at least one emitter primary coil,
   the deformable element being associated with an amagnetic metal target having a planar surface, a variation in the position of the target moving along the predetermined axis occurring under pressure from a hand of the user on the opening element handle or frame, wherein the primary coil has turns wound in a plane parallel to a plane of the surface of the target, at least one receiver secondary coil that receives a magnetic field and a voltage induced by said at least one primary coil and is located facing said at least one primary coil with its turns wound in a plane parallel to the plane of the turns of said at least one primary coil and with the target at least partially intercalated between said at least one primary coil and said at least one secondary coil when pressure from the user is applied to the opening element handle or the frame, a variation in the induced magnetic field received by said at least one secondary coil being detected by measurement means for measuring a parameter resulting from the voltage induced in the secondary coil when pressure from a hand of the user is applied to the opening element handle or frame.

2. The detection device as claimed in claim 1, wherein said at least one primary coil and secondary coil have their turns wound and centered around a width of the printed circuit board which is planar and perpendicular to the planes of said at least one primary coil and secondary coil, a normal to the plane of the turns of said at least one primary coil and secondary coil extending in the plane of the printed circuit board.

3. The detection device as claimed in claim 2, wherein the turns of said at least one primary coil and secondary coil are wound while passing through a thickness of the printed circuit board.

4. The detection device as claimed in claim 2, wherein the printed circuit board has a groove running widthwise in the printed circuit board, an end portion of the target being inserted into the printed circuit board when pressure from a hand of the user is applied to the handle, an internal contour of the groove corresponding to an external contour of the target, dimensions of the internal contour of the groove being at least slightly larger than the dimensions of the external contour of the end portion of the target in order to allow insertion of the end portion of the target with clearance.

5. The detection device as claimed in claim 4, wherein the groove passes through an entire thickness of the printed circuit board, one face of the printed circuit board opposite the face via which the target is inserted bearing a resilient deformable part having a flange that bears against the opposite face of the printed circuit board and an end piece that penetrates into the groove with a depth allowing it make contact and to be deformed by contact with the end portion of the target inserted into the groove in the maximum insertion position, the end piece returning to an undeformed position while pushing the end portion of the target out of the groove when no pressure from the hand of the user is exerted on the deformable contact element.

6. The detection device as claimed in claim 1, further comprising two emitter primary coils that are coupled on each side of the target or on the same side of the target.

7. The detection device as claimed in claim 1, further comprising two receiver secondary coils that are arranged on the same side of the target while being electrically independent.

8. The detection device as claimed in claim 7, wherein the two secondary coils are concentric, with a first secondary coil comprising two loops in opposite directions and of equal area generating a sine signal of said at least one parameter resulting from the voltage induced in the first secondary coil and a second secondary coil comprising three loops including one large loop and two small loops, the two small loops being in the same direction and in the opposite direction to the large loop, the second secondary coil generating a cosine signal of said at least one parameter resulting from the voltage induced in the second secondary coil, the sine or cosine signals of the first and second secondary coils, respectively, being temporally correlated by calculation means in order to precisely determine the position of the target in the detection device.

9. The detection device as claimed in claim 1, wherein the target is made of a conductive material of low resistivity.

10. The detection device as claimed in claim 1, wherein the element that is elastically deformable along a predetermined axis comprising a region of contact with the handle comprises a central body bearing the contact region and a longitudinal end of the target in opposition, the central body being borne by at least one member that is deformable along the predetermined axis, one end of which is connected to the central body and another, opposite end bears against the printed circuit board, a deformation of said at least one deformable member under pressure from a hand of the user on the handle resulting in a variation in the position of the target moving along the predetermined axis.

11. An external handle or frame of an opening element of a motor vehicle, comprising a detection device as claimed claim 1 and at least one elastically deformable external contour region that is aligned along the predetermined axis with the contact region.

12. A motor vehicle, comprising at least one opening element handle or frame as claimed in claim 11 on at least one opening element.

13. The detection device as claimed in claim 3, wherein the printed circuit board has a groove running widthwise in the printed circuit board, an end portion of the target being inserted into the printed circuit board when pressure from a hand of the user is applied to the handle, an internal contour of the groove corresponding to an external contour of the target, dimensions of the internal contour of the groove being at least slightly larger than the dimensions of the external contour of the end portion of the target in order to allow insertion of the end portion of the target with clearance.

* * * * *